(12) United States Patent
Rogers

(10) Patent No.: US 8,506,826 B2
(45) Date of Patent: Aug. 13, 2013

(54) METHOD OF MANUFACTURING A SWITCH SYSTEM

(75) Inventor: John E. Rogers, Vero Beach, FL (US)

(73) Assignee: Harris Corporation, Melbourne, FL (US)

( * ) Notice: Subject to any disclaimer, the term of this patent is extended or adjusted under 35 U.S.C. 154(b) by 136 days.

(21) Appl. No.: 13/195,949

(22) Filed: Aug. 2, 2011

(65) Prior Publication Data

US 2013/0032570 A1 Feb. 7, 2013

(51) Int. Cl.
*C23F 1/00* (2006.01)

(52) U.S. Cl.
USPC .......... 216/2; 216/18; 216/65; 333/262; 200/181; 200/600; 427/63; 427/96.1; 427/290

(58) Field of Classification Search
USPC .......... 216/2, 18, 65; 333/262; 200/81, 200/181, 600; 427/63, 96.1, 290
See application file for complete search history.

(56) References Cited

U.S. PATENT DOCUMENTS

| | | | |
|---|---|---|---|
| 6,046,659 A * | 4/2000 | Loo et al. ............... | 333/262 |
| 6,064,108 A | 5/2000 | Martinez | |
| 6,410,360 B1 * | 6/2002 | Steenberge ............. | 438/52 |
| 6,756,708 B2 | 6/2004 | Koeneman | |
| 6,908,809 B1 | 6/2005 | Provo et al. | |
| 6,972,635 B2 | 12/2005 | McCorquodale et al. | |
| 7,035,083 B2 | 4/2006 | Lin et al. | |
| 7,145,213 B1 * | 12/2006 | Ebel et al. ............. | 257/414 |
| 7,671,515 B2 | 3/2010 | Metz et al. | |
| 2004/0061543 A1 | 4/2004 | Nam et al. | |
| 2005/0006335 A1 * | 1/2005 | Wargo et al. ........... | 216/18 |
| 2005/0253257 A1 * | 11/2005 | Chiu et al. ............. | 257/724 |
| 2006/0203421 A1 | 9/2006 | Morris et al. | |
| 2007/0256502 A1 | 11/2007 | Aebersold et al. | |
| 2008/0055815 A1 | 3/2008 | Rottenberg | |
| 2008/0122020 A1 | 5/2008 | Metz et al. | |
| 2010/0207217 A1 | 8/2010 | Zuniga-Ortiz et al. | |

OTHER PUBLICATIONS

Samavati, H., et al., "Fractal Capacitors", IEEE Journal of Solid-State Circuits, vol. 33, No. 12, Dec. 1998; pp. 2035-2041.
Kim, K., et al., "Circuit Modeling of Interdigitated Capacitors Fabricated by High-K LTCC Sheets", ETRI Journal, vol. 28, No. 2, Apr. 2006; pp. 182-190.
Ramadoss, R., et al., "RF-MEMS Capacitive Switches Fabricated Using Printed Circuit Processing Techniques", Journal of Microelectromechanical Systems, vol. 15, No. 6, Dec. 2006.
International Search Report mailed Nov. 22, 2012; International Application Serial No. PCT/US2012/049169 in the name of Harris Corporation.

* cited by examiner

*Primary Examiner* — Lan Vinh
*Assistant Examiner* — Maki Angadi
(74) *Attorney, Agent, or Firm* — Fox Rothschild, LLP; Robert J. Sacco

(57) ABSTRACT

A method for manufacturing a micro electro-mechanical system (MEMS) switch system (600, 700) includes etching each of a plurality of base circuit layers (425) and a plurality of passive component substrate layers (412, 418, 42, 426). The method continues with laser milling of a first dielectric film (406) to create a spacer layer (405). A metal cladding (402, 403) formed on a flexible dielectric film layer 404 is etched so as to form a plurality of switch component features. Further laser milling is performed with respect to the flexible dielectric film layer to form at least one switch structure (448, 450). Thereafter, a stack (400) is assembled which is comprised of the spacer layer disposed between the flexible dielectric film layer and the plurality of base circuit layers. Additional layers can also be included in the stack. When the stack is completed, heat and pressure are applied to join the various layers forming the stack.

20 Claims, 8 Drawing Sheets

METHOD OF MANUFACTURING A SWITCH SYSTEM

BACKGROUND OF THE INVENTION

1. Statement of the Technical Field

The inventive arrangements relate to filters, and more particularly to miniature filters that are low in cost and easily fabricated.

2. Description of the Related Art

Filter banks in radio frequency (RF) systems are typically comprised of thin-film passive devices and associated switching circuitry While these systems can work well, they generally require large investments in state-of-the-art processing technologies. These expensive development costs tend to drive up the cost of miniaturized filters.

Micro electro-mechanical system (MEMS) type switch devices are known in the art. For example, meso-scale MEMS devices with a cantilevered beam have been constructed on a printed wiring board. In such systems, the cantilevered beam can be at least partially constructed of a polymer material to constitute its length. The beam is attached to a post on one end thereof and is cantilevered over the printed wiring board. One or more conductive surfaces are formed in opposition to one another on the beam and the printed wiring board to form capacitor plates, switch closure pads and other useful mechanisms. Consequently, the beam can be transitioned between an "on" position and an "off" position.

SUMMARY OF THE INVENTION

Embodiments of the invention concern a method for manufacturing a micro electro-mechanical system (MEMS) switch system. The method can begin with forming each of a plurality of base circuit layers. The base circuit layers are formed by etching a plurality of conductive metal layers respectively disposed on a plurality of substrate layers. The method further includes etching a plurality of passive component conductive metal layers disposed respectively on a plurality of passive component substrate layers. Laser milling of a dielectric film layer is performed to create a spacer layer. A conductive metal layer disposed on a flexible second dielectric film layer is etched so as to form a plurality of switch component features. Further laser milling is performed with respect to the flexible dielectric film layer to form at least one switch structure. Thereafter, a stack is assembled which is comprised of the spacer layer disposed between the flexible dielectric film layer and the plurality of base circuit layers. Additional layers can also be included in the stack. When the stack is completed, heat and pressure are applied to join the various layers forming the stack.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Figure 1:
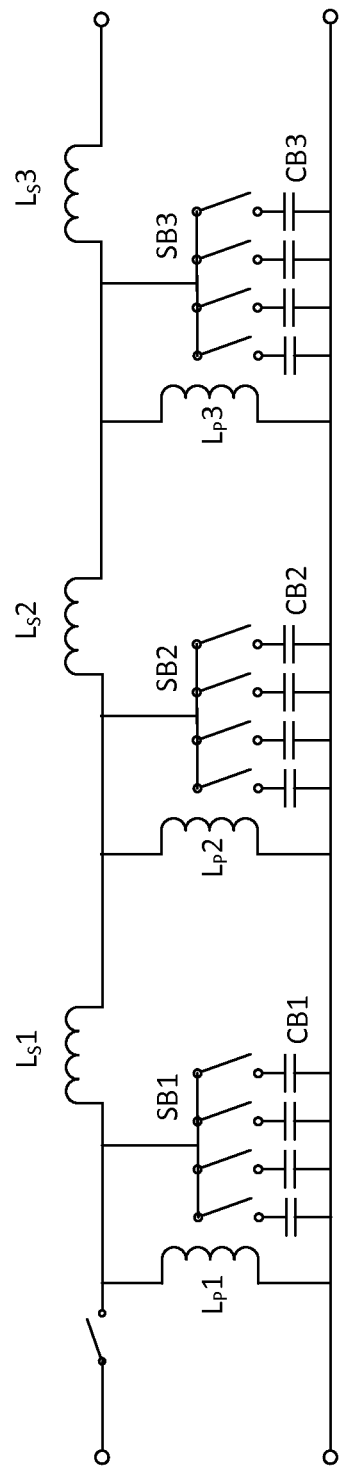
FIG. 1 is a circuit diagram that is useful for understanding a method of manufacturing a switching system.

Referring now to FIG. 1 there is shown an example of a switch system 100. In this example the switch system is used to implement a three-pole Chebyshev ladder filter with a plurality of switch selectable passive filter components. The selectable passive filter components permit the characteristics of the filter to be selectively varied. The filter shown includes series inductors LSn (where n refers to pole 1, 2, or 3). Accordingly, the filter shown includes series inductors $L_S1$, $L_S2$, $L_S3$. The filter also includes parallel inductors $L_P1$, $L_P2$, $L_P3$, capacitor banks CB1, CB2, CB3, and switch banks SB1, SB2, SB3. Each of the capacitor banks CB1, CB2, CB3 include a plurality of capacitors $CBn_i$ that can be selectively included or removed from the filter circuit in accordance with a position of a plurality of switches $SBn_i$ provided by a respective switch bank SBn.

As is known in the art, changing the values of passive filter components will result in different RF filter characteristics. Accordingly, in switch system 100 a plurality of different RF filter functions can be provided by changing the switch positions in switch banks SB1, SB2, SB3 to insert or remove passive components (in this example, capacitors $CBn_i$). Control circuitry (not shown) can be used to selectively change the position of the switches in the switch banks SB1, SB2, SB3. The control circuitry can include driver circuitry for automatically changing the switch positions. In some instances, a controller, memory device (PROM) or microprocessor can be used to determine suitable switch positions as needed to implement desired filter functions. Control circuitry of this type is well known in the art and therefore will not be described here in detail. Also, it should be understood that while a three-pole Chebyshev ladder filter is used in this example as an aid to understanding, the invention is not intended to be limited to filter circuits. Instead, the inventive arrangements can be used in any type of circuit that includes MEMS switches.

Figure 2:
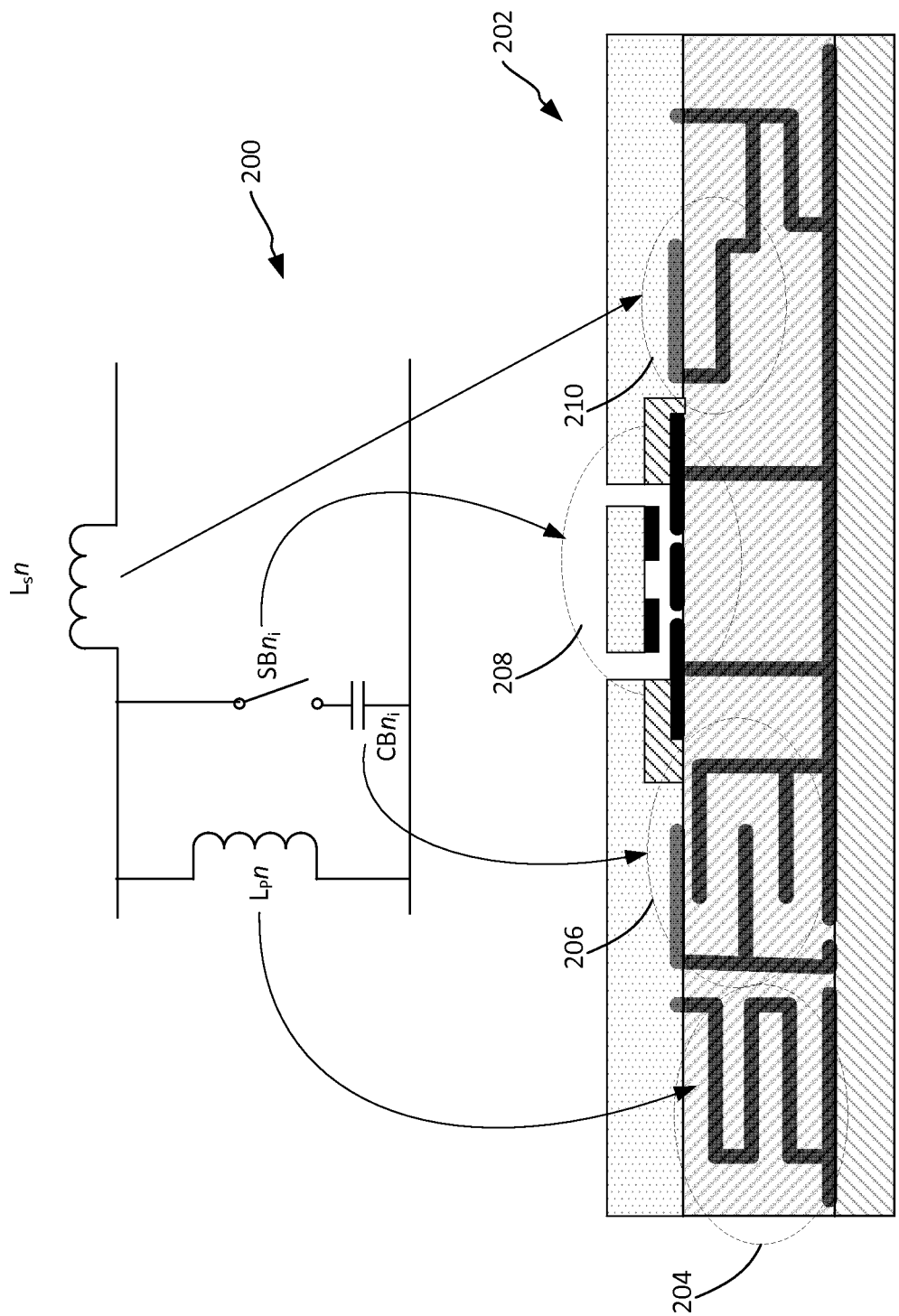
FIG. 2 is a diagram that is useful for understanding how various components of the switch system in FIG. 1 can be fabricated.

Referring now to FIG. 2, there is shown a single pole (pole n) 200 of a filter that is similar to the filter included in the switch system 100. The filter pole 200 in this example includes series inductor $L_s n$ and parallel inductor $L_p n$. As an aid in understanding the inventive concept, only a single switch $SBn_i$ and a single capacitor $CBn_i$ are shown in FIG. 2; however it should be understood that a plurality of each such device would normally be included. The various components of the filter pole 200 can be implemented in a multi-layer switch system 202 as shown. In particular, components $L_p n$, $CBn_i$, $SBn_i$, and $L_s n$ are respectively formed from structures 204, 206, 208, and 210 in multi-layer switch system 202. Methods for forming embedded passive circuit elements in multi-layer printed wiring boards are generally well known in the art; accordingly, the fabrication process for passive circuit elements $L_p n$, $CBn_i$, and $L_s n$ will not be described here in detail. The inventive arrangements hereinafter described will instead focus on manufacturing methods for fabricating switch systems 202 incorporating a MEMS switch structure 208.

Figure 3:
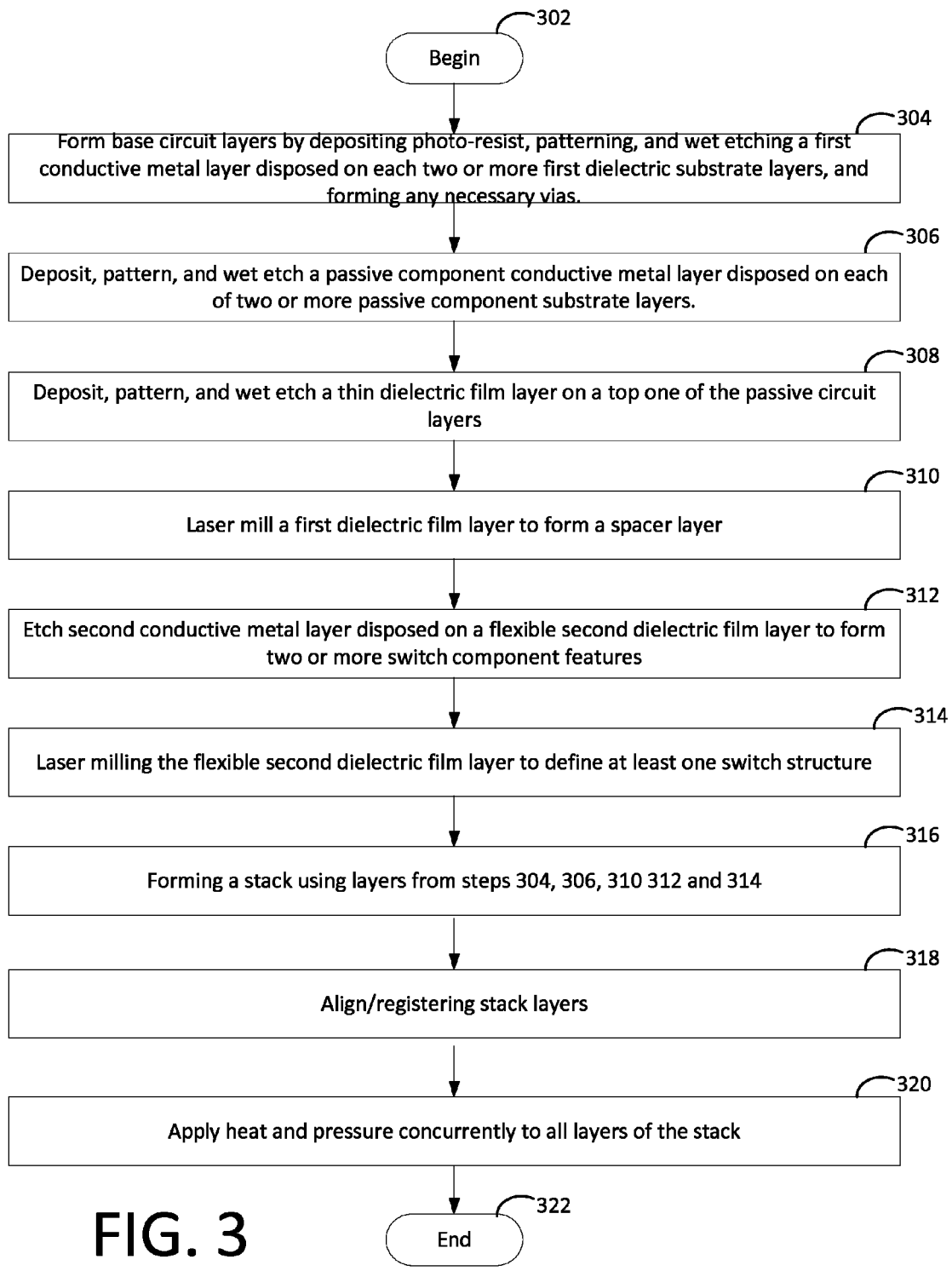
FIG. 3 is a flowchart that is useful for understanding the method of manufacturing the switch system in FIG. 2.

Referring now to FIG. 3, there is provided a flow chart that is useful for understanding a process for manufacturing a switch system in accordance with the inventive arrangements. The process shown in FIG. 3 will be explained with reference to the stack 400 shown in FIGS. 4 and 5. The method begins in step 302 and continues to step 304. In step 304, each of two or more base circuit layers 425 is formed by etching a first conductive metal layer 428, 432, 436 respectively disposed on dielectric substrate layers 430, 434, 438. The dielectric substrate layer can be formed of any rigid or semi-rigid dielectric material that is compatible with the remainder of the process steps described herein. For example in one embodiment, the dielectric substrate layers 425 can be a PTFE-based laminate and the conductive metal layer can be copper cladding. Such material is commercially available under various trade names, such as RT Duroid 5870 from Rogers Corporation of Chandler, Ariz. According to a preferred embodiment, the etching pattern for conductive metal layers 428, 432, 436 is advantageously selected to form in the two or more of base circuit layers a circuit configured for performing one or more switch related functions as would be known to one skilled in the art. For example, such switch related functions can include controlling the switch and routing signals to or from the switch. These base circuit layers can also be used to interconnect one or more passive components described below, and to provide input/output circuitry for a filter circuit disposed within the passive component substrate layers 412, 418, 422, 426, which are described in more detail below.

The etching process in step 304 includes disposing a suitable photo-resist layer and patterning the photo-resist layer in preparation for the wet etching step, as would be known to one skilled in the art. Step 304 can also include drilling one or more bores 442 and filling the bores with a conductive metal paste to form vias which extend through each layer. A conductive material, such as copper can be used to form bumps 440 disposed on the bottom of one of the substrate layers 438 to facilitate forming electrical connections with an external circuit. The foregoing steps are well known to those skilled in the art and therefore will not be described here in detail.

In step 306, the method continues by wet etching a passive component conductive metal layer 410, 416, 420, 424 disposed on passive component substrate layers 412, 418, 422, 426. The passive component substrate layers are advantageously formed of a dielectric material. Any suitable dielectric material can be used for this purpose, provided that it is compatible with the remainder of the process steps described herein and provides suitable electrical/mechanical performance. According to a preferred embodiment, the passive component is a thermally stabilized, polyolefin co-polymer with a copper cladding layer on one or both sides of the material. Dielectric material layers of this kind are available under the trade name Interra™ HK 04 from Dupont Corporation. A liquid crystal polymer (LCP) can also be used for this purpose without limitation.

As will be appreciated by those skilled in the art, the etching process in step 306 can also include disposing a suitable photo-resist layer on the passive component conductive metal layers 410, 416, 420, 424, and patterning the photo-resist layer in preparation for the etching step. Step 306 can also include drilling one or more bores 444 and filling the bores with a conductive metal paste to form vias extending through each layer.

Figure 4:
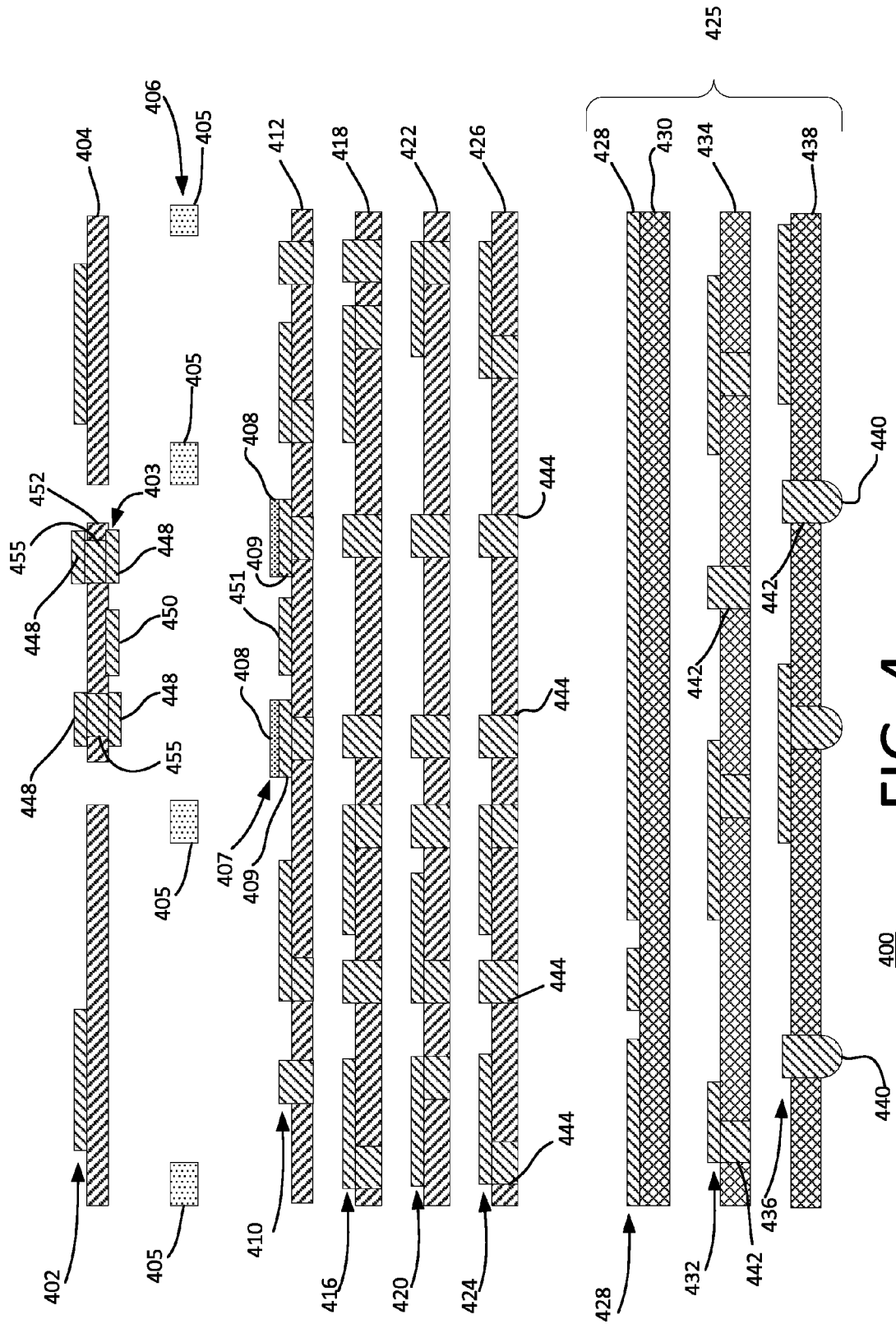
FIG. 4 is a stack of layers that is useful for understanding the method in FIG. 3.
Figure 5:
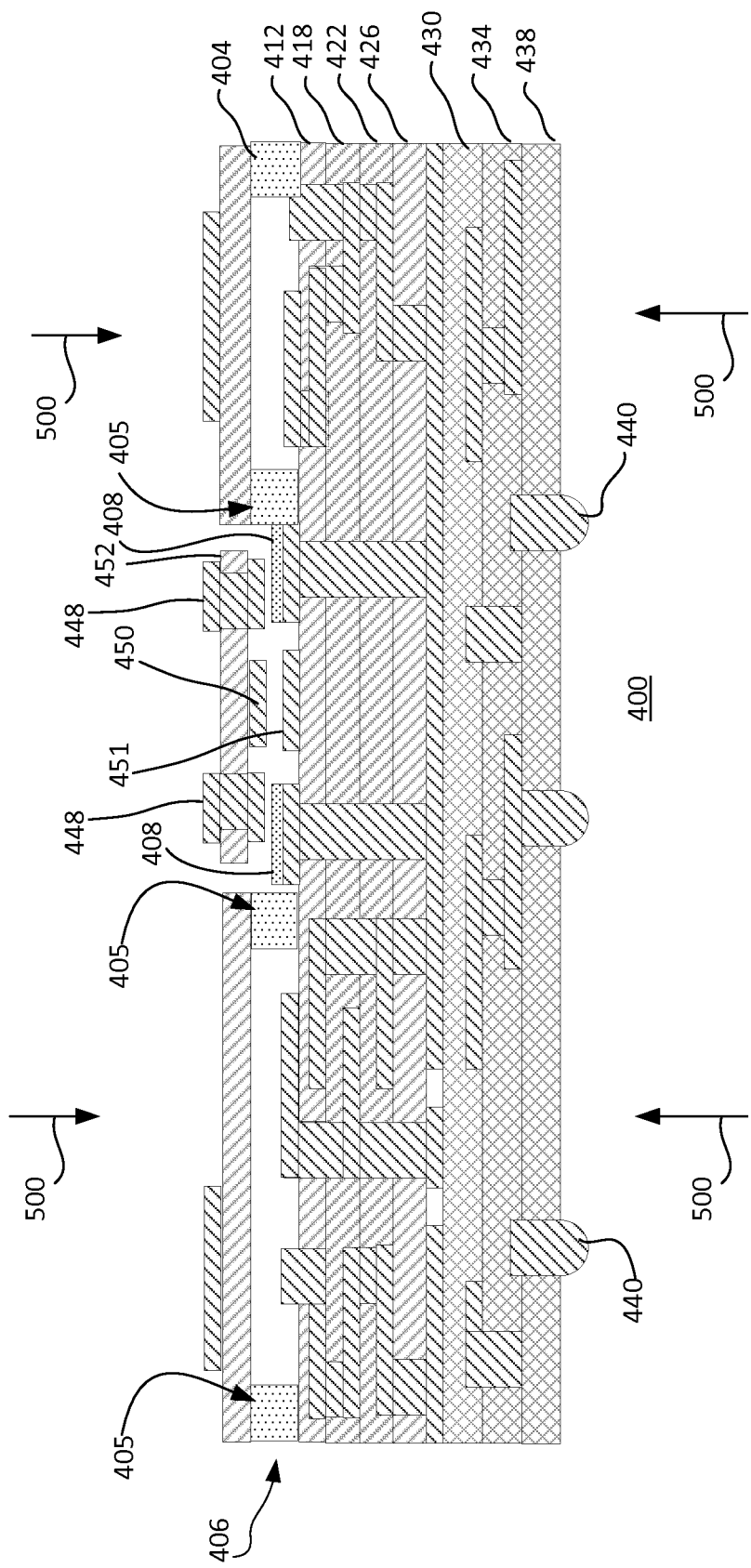
FIG. 5 shows the stack in FIG. 4, following the application of heat and pressure.

The etching and drilling steps described in relation to step 306 are performed so as to form portions of one or more passive components, such as inductors and capacitors. Etching patterns and techniques for forming passive components in this way are well known in the art and therefore will not be described here in detail. Still, it should be understood that one or more passive components $L_p n$, $CBn_i$, and $L_s n$ can be formed in this way, as previously described in relation to FIG. 2. In some embodiments, the etching of passive component conductive metal layers can be selected so that the various passive components form an RF filter when the passive component substrate layers are arranged in a stack as shown in FIGS. 4 and 5. In addition to such passive components, this etching step 306 can involve forming one or more conductive electrostatic actuator members 409 and at least one conductive switch contact member 451 on the surface of an upper-most substrate layer 412. The purpose of these switch component features will become more apparent as the discussion progresses.

The method continues with step 308, which involves depositing a thin dielectric film layer 407. The thin dielectric film layer 407 can be any suitable dielectric film that is compatible with the remaining process steps described herein, and which has suitable electrical/mechanical properties. Commercially available examples of such thin dielectric film layers include well known polymers derived from B-staged bis-benzocyclobutene (BCB) chemistry, and HD-4100 (which is available from HD MicroSystems of Parlin, N.J.). The thin dielectric film layer 407 is disposed on the passive component conductive metal layer 409 on an uppermost one of the passive component substrate layers 412. Thereafter, the thin dielectric film layer 407 is patterned with a suitable photo-resist and wet etched using techniques that are known in the art. The etching process advantageously results in the formation of one or more insulating pads 408 which disposed on each of the conductive electrostatic actuator members 409.

The method continues with step 310, which involves laser milling of a dielectric film 406 to form a spacer layer 405. According to a preferred embodiment, a material forming the dielectric film 406 can be any thermally stabilized polymer that is compatible with the remaining process steps described herein, and which exhibits suitable electrical and mechanical properties. For example, irradiated polyolefin co-polymers, developed for bonding single or multi-layer circuit boards, can be used for such purpose. Such materials are commercially available as Polyflon Bonding Film, which is available from Polyflon® Company of Norwalk, Conn.

In step 312, the process continues with etching a conductive metal cladding layer 402, 403 disposed on opposing sides of a flexible dielectric film layer 404 to form switch component features. This step can also include disposing a suitable photo-resist layer on the conductive metal layer, and patterning the photo-resist layer in preparation for the etching step, as would be known to one skilled in the art. Step 312 can also include drilling one or more bores 455 and filling the bores with a conductive metal paste to form vias extending through the flexible dielectric film layer. The switch component features thus formed include conductive electrostatic actuator members 448 and switch contact member 450. These actuator members 448 are advantageously aligned with conductive electrostatic actuator members 409 when the various layers are arranged in a stack as shown in FIG. 4. Likewise, the switch contact member 450 is aligned with switch contact member 451. In some embodiments, corresponding conductive metal features are advantageously replicated on opposing surfaces of the flexible dielectric film layer 404 so as to minimize warpage during a thermal compression step described below. Such an arrangement is best understood with reference to FIG. 7, which shows switch actuator members 448 and switch contact member 450 replicated on opposing surfaces of the flexible dielectric film layer.

Thereafter the method continues in step 314 with laser milling the flexible dielectric film layer 404 to define at least one switch structure 452. As best understood from FIGS. 6 and 7, the switch structure 452 is advantageously formed to include at least one resilient beam member 604 that is integrally formed with said flexible dielectric film layer 404. The flexible dielectric film layer can be formed of any suitable material that is compatible with the remainder of the process steps described herein and which provides suitable mechanical and electrical properties. For example, a polyimide film layer can be used for this purpose. Polyimide films of this kind are available from DuPont Corporation under the trade name Kapton®.

Figure 7:
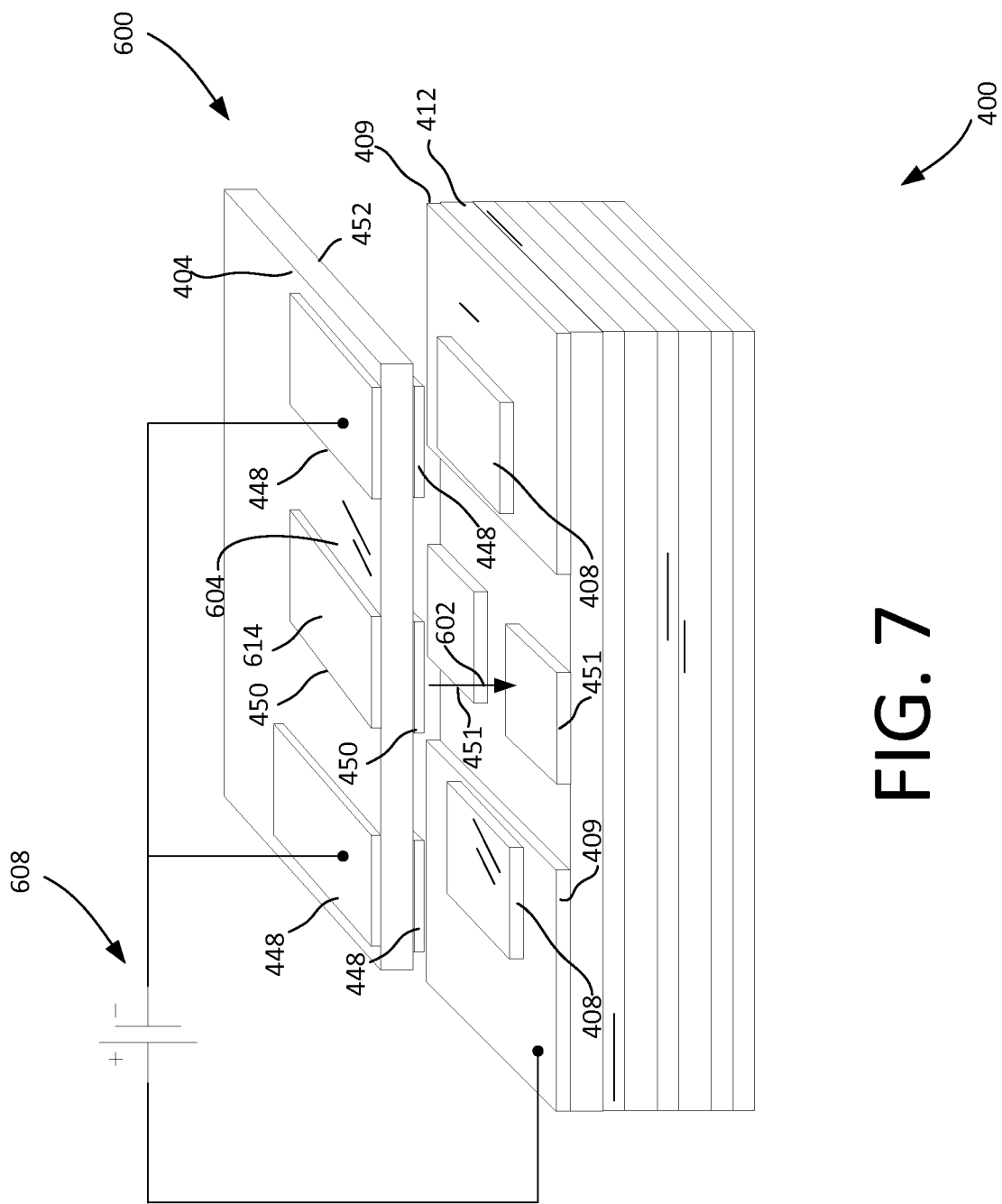
FIG. 7 is an enlarged view of a switch contact and actuator portion of the MEMS switch in FIG. 6.

Referring once again to step 310, the laser milling of the dielectric film 406 advantageously includes forming at least one support post 606 arranged to support an end portion of the resilient beam member 604. In the embodiment shown, the resilient beam member 604 is supported on two opposing ends 610, 612 and flexes in a medial center portion 614 in the direction of arrow 602 when a bias voltage is applied across actuator members 448, 409 from a voltage source 608. However, the invention is not limited in this regard and the resilient beam member can also be supported on a single end (e.g. 612) in a cantilever arrangement to allow an opposing end to flex as shown in FIG. 7. Either structure can be fabricated using the manufacturing process described herein.

With the foregoing arrangement, conductive electrical contact 450 is held resiliently spaced apart from at least one switch contact member 451 by the resilient beam member 604 when the stack 400 is finally assembled as described below. This arrangement is best understood with reference to FIG. 6, which shows an enlarged and partially cut away perspective view of the stack in FIG. 5. Similarly, conductive electrostatic actuator members 448 are held resiliently spaced apart and opposed from conductive electrostatic actuator members 409. As will also be understood from FIG. 6, insulating pads 408, disposed on each of the conductive electrostatic actuator members 409, ensure that the electrostatic actuator members 448, 409 cannot form an electrical contact when the resilient beam member 604 flexes in the direction of arrow 602.

In step 316, the various layers from steps 304, 306, 310, 312 and 314 are assembled together to form a stack as shown in FIG. 4. The layers are registered in step 318 to ensure proper alignment of the various structures formed in each layer. Conventional registration and alignment techniques for printed wiring board layers can be used for this purpose, as would be understood by one skilled in the art. After the registration process is complete, pressure is applied to the stack in step 320 as shown by arrows 500 in FIG. 5. This step also includes the application of heat to the stack concurrently with the application of such pressure (thermo-compression). The combination of heat and pressure bonds the various layers of the stack together. The particular parameters of heat and pressure used will depend on the selection of materials. However, in an exemplary embodiment the thermo-compression can involve using two steel bonding jigs (plates) with alignment holes that would sandwich the materials (which also can have alignment holes) together. The bonding pressure can be at a pressure such as 80 pounds per square inch (psi), which, in the case of a 2 in×2 in surface area, would correspond to a 320 lb load. Once the pressure is applied, the temperature can be increased to about 130° C. This pressure and temperature is maintained for a time period such as 5 minutes. The assembly is then cooled to room temperature (by annealing) before the pressure is released. When the thermo-compression is completed, the process can terminate in step 322 with the completed switching system as shown in FIG. 5.

Figure 6:
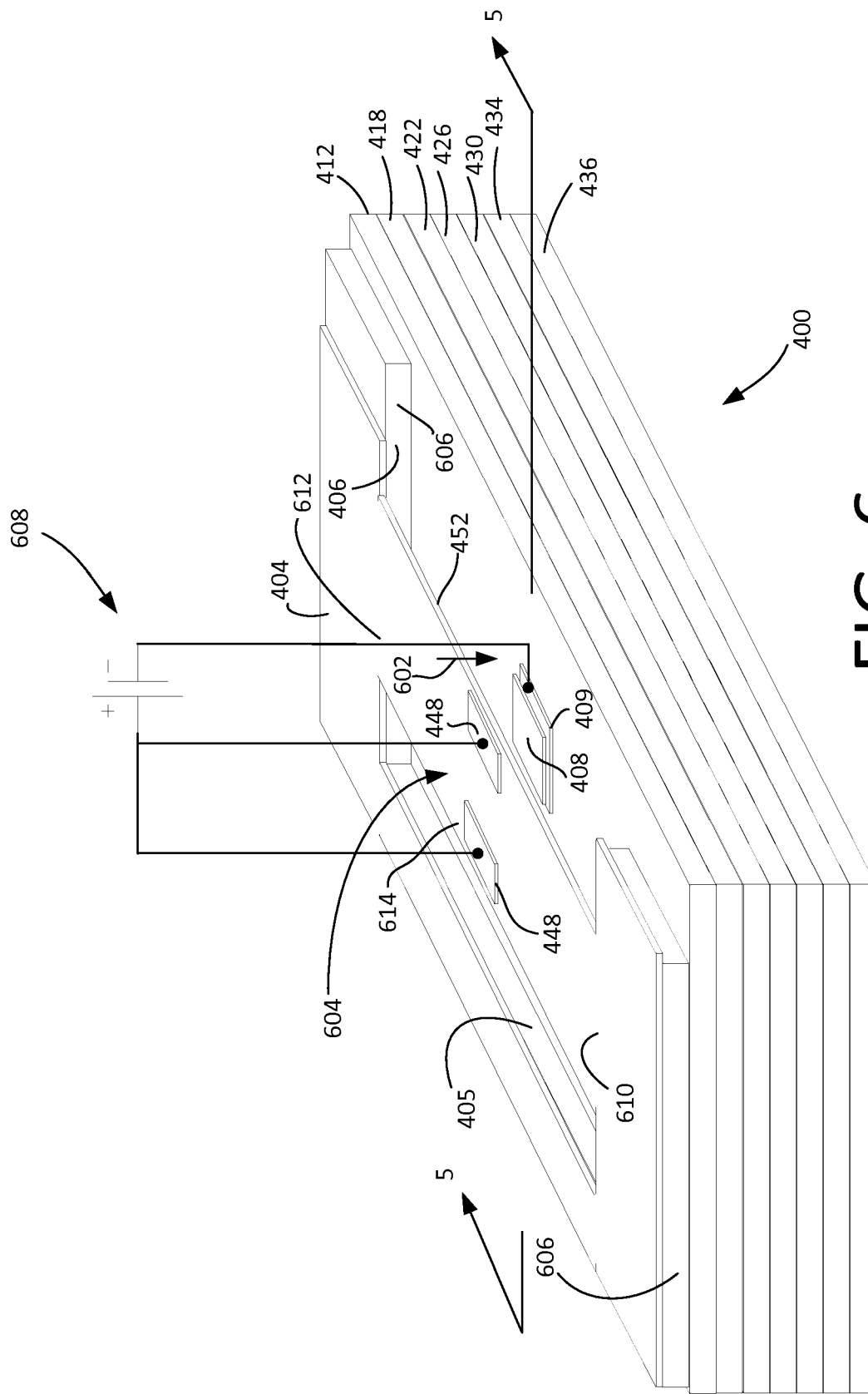
FIG. 6 is an enlarged perspective view of a portion of the stack in FIG. 5, and showing the overall structure of a MEMS switch.
Figure 8:
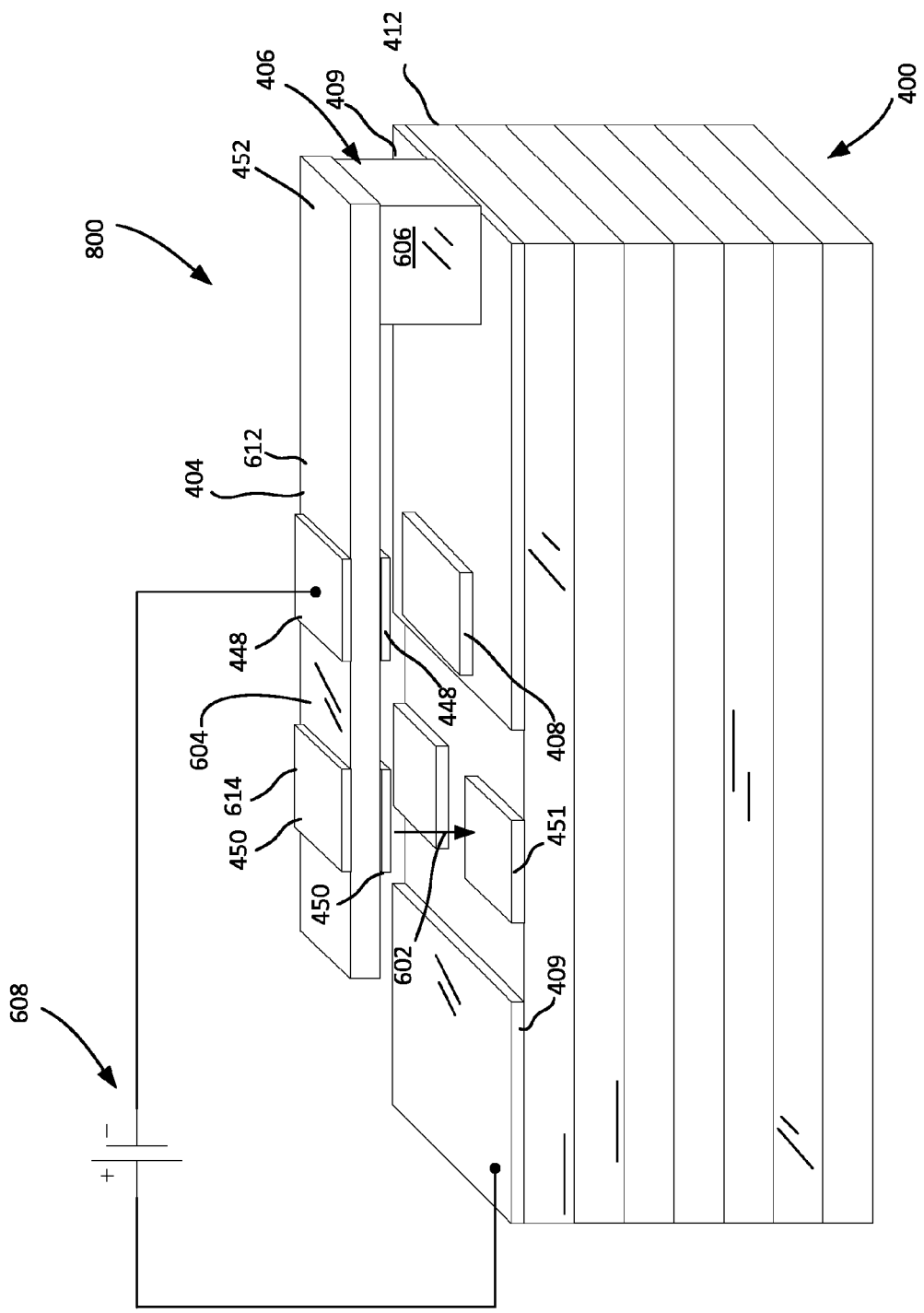
FIG. 8 is a perspective view of an alternative embodiment MEMS switch which can be fabricated using the method in FIG. 3.

Referring now to FIGS. 6, 7 and 8, the operation of an exemplary switch 600, 800 formed within stack 400 will now be described in greater detail. When a bias voltage provided by a voltage source 608 is applied across the electrostatic actuator members 448, 409, the resulting electrostatic attraction between the actuator members will cause the resilient beam member 604 to flex in the direction of arrow 602. If a large enough bias voltage is applied, the plates will close. This voltage is known as the pull-in voltage. This flexing and closing action will allow an electrical contact to be formed between the switch contact member 450 and one or more switch contact members 451 on the surface of an upper-most substrate layer 412. When the bias voltage is removed, the resilient beam member will return to its original position shown in FIGS. 6, 7 and 8.

Notably, only a single switch is shown in the fabrication process description provided with respect to FIGS. 4-8. However, it should be understood that a typical switching system would normally include a plurality of switches as shown in FIG. 1. Accordingly, the switch system described herein is not intended to be limited in this regard.

The switching system of the present invention utilizes chemical etching, laser milling or machining, and thermal compression to create a low cost solution to a switching system. This arrangement is particularly advantageous when developing switch systems incorporating RF filters as shown in FIG. 1. Notably, these switch systems can be fabricated without use of silicon micro-fabrication equipment such as deep reactive ion etching (DRIE) or standard reactive ion etching (RIE), which is typically required for silicon-based MEMS switches. The switches are laser etched, making unique design geometries easily possible. The ability to fabricate these switches using printed wiring board processes makes for quick design cycles and low-cost RF solutions. Those skilled in the art that the process has been described here primarily with respect to a filter application, but can also be used in other switch systems such as antenna arrays and tuning circuits.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

I claim:

1. A method for manufacturing a micro electro-mechanical system (MEMS) switch system, comprising:
    forming each of a plurality of base circuit layers by etching a plurality of first conductive metal layers respectively disposed on a plurality of dielectric substrate layers;
    laser milling a first dielectric film layer to form a spacer layer;
    etching a second conductive metal layer disposed on a first surface of a flexible second dielectric film layer to form a plurality of switch component features;
    replicating at least a portion of the plurality of switch component features on a second surface opposed from the first surface of the flexible second dielectric film layer;
    laser milling the flexible second dielectric film layer to form at least one switch structure;
    forming a stack comprised of the spacer layer disposed between the flexible second dielectric film layer and the plurality of base circuit layers; and
    applying heat and pressure to the stack.

2. The method according to claim 1, further comprising selecting a PTFE-based laminate as a material for said plurality of first substrate layers.

3. The method according to claim 1, further comprising selecting a thermally stabilized, polyolefin co-polymer as a material for said first dielectric film layer.

4. The method according to claim 1, further comprising selecting a material of said flexible second dielectric film layer to be a polyimide.

5. The method according to claim 1, further comprising etching a plurality of passive component conductive metal layers disposed respectively on a plurality of passive component substrate layers.

6. The method according to claim 5, further comprising selecting a polyimide dielectric as a material of said passive component substrate layers.

7. The method according to claim 5, further comprising including in said stack said plurality of passive component substrate layers disposed between said spacer layer and said plurality of base circuit layers.

8. The method according to claim 6, further comprising selecting an etching pattern for each of said plurality of passive component conductive metal layers to form an RF filter when said passive component substrate layers are arranged in said stack.

9. The method according to claim 5, further comprising selecting said switch structure to include at least one resilient beam member integrally formed with said flexible second dielectric film layer.

10. The method according to claim 9, wherein said laser milling of said first dielectric film layer further comprises forming at least one support post arranged to support an end portion of said resilient beam member.

11. The method according to claim 10, further comprising selecting a size and geometry of at least one of said switch component features disposed on said flexible second dielectric film layer to form a conductive electrical contact which is held resiliently spaced apart from at least one switch contact member by said resilient beam member at the completion of said application of heat and pressure.

12. The method according to claim 10, further comprising selecting a size and geometry of a least one of said switch component features disposed on said flexible second dielectric film layer to form a first conductive electrostatic actuator member which is held resiliently spaced apart and opposed from at least a second conductive electrostatic actuator member disposed on one of said passive component substrate layers.

13. The method according to claim 12, further comprising etching a third dielectric film layer to form an insulating pad disposed between said first conductive electrostatic actuator member and said second conductive electrostatic actuator member.

14. The method according to claim 10, further comprising selecting an etching pattern for each of said first plurality of conductive metal layers to form in said plurality of base circuit layers a circuit configured for performing at least one function selected from the group of controlling said switch and routing signals to or from said switch.

15. A method for manufacturing a micro electro-mechanical system (MEMS) switch system, comprising:
    forming each of a plurality of base circuit layers by etching a plurality of first conductive metal layers respectively disposed on a plurality of dielectric substrate layers;
    etching a plurality of passive component conductive metal layers disposed respectively on a plurality of passive component substrate layers
    laser milling a first dielectric film layer to form a spacer layer;
    etching a second conductive metal layer disposed on a first surface of a flexible second dielectric film layer to form a plurality of switch component features;
    replicating at least a portion of the plurality of switch component features on a second surface opposed from the first surface of the flexible second dielectric film layer;
    laser milling the flexible second dielectric film layer to form at least one switch structure;
    forming a stack comprised of the spacer layer disposed between the flexible second dielectric film layer and said plurality of passive component substrate layers, and with said plurality of passive component substrate layers disposed between the spacer layer and the plurality of base circuit layers; and
    applying heat and pressure to the stack.

16. The method according to claim 15, further comprising selecting an etching pattern for each of said plurality of passive component conductive metal layers to form an RF filter when said passive component substrate layers are arranged in said stack.

17. The method according to claim 16, further comprising selecting said switch structure to include at least one resilient beam member integrally formed with said flexible second dielectric film layer.

18. The method according to claim 17, wherein said laser milling of said first dielectric film layer further comprises forming at least one support post arranged to support an end portion of said resilient beam member.

19. The method according to claim 17, further comprising selecting a size and geometry of at least one of said switch component features disposed on said flexible second dielectric film layer to form a conductive electrical contact which is held resiliently spaced apart from at least one switch contact member by said resilient beam member at the completion of said application of heat and pressure.

20. The method according to claim 17, further comprising selecting a size and geometry of a least one of said switch component features disposed on said flexible second dielectric film layer to form a first conductive electrostatic actuator member which is held resiliently spaced apart and opposed from at least a second conductive electrostatic actuator member disposed on one of said passive component substrate layers.

\* \* \* \* \*